US007873082B2

(12) United States Patent
Takabayashi

(10) Patent No.: US 7,873,082 B2
(45) Date of Patent: Jan. 18, 2011

(54) SEMICONDUCTOR INTEGRATED DEVICE

(75) Inventor: Kazumasa Takabayashi, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/545,422

(22) Filed: Aug. 21, 2009

(65) Prior Publication Data

US 2009/0310630 A1 Dec. 17, 2009

Related U.S. Application Data

(63) Continuation of application No. PCT/JP2007/054330, filed on Mar. 6, 2007.

(51) Int. Cl.
*H01S 3/10* (2006.01)
*H01S 5/00* (2006.01)
(52) U.S. Cl. .............. 372/20; 372/50.1; 372/50.11; 372/50.12; 372/50.121
(58) Field of Classification Search .............. 372/20, 372/50.1–50.121, 102
See application file for complete search history.

(56) References Cited

U.S. PATENT DOCUMENTS

| 5,384,797 | A | * | 1/1995 | Welch et al. ................. 372/23 |
| 5,536,085 | A | * | 7/1996 | Li et al. .................... 372/50.12 |
| 6,643,315 | B2 | * | 11/2003 | Kasukawa et al. ............. 372/96 |
| 7,277,462 | B2 | * | 10/2007 | Paoletti et al. ......... 372/50.121 |
| 7,366,220 | B2 | | 4/2008 | Takabayashi |
| 2002/0181532 | A1 | * | 12/2002 | Ryu et al. ..................... 372/50 |
| 2004/0228384 | A1 | * | 11/2004 | Oh et al. ...................... 372/96 |
| 2006/0209911 | A1 | * | 9/2006 | Takabayashi ................. 372/20 |

FOREIGN PATENT DOCUMENTS

| JP | 10-090508 A | 4/1998 |
| JP | 2002-006352 A | 1/2002 |
| JP | 2003-315581 A | 11/2003 |
| JP | 2006-295103 A | 10/2006 |

OTHER PUBLICATIONS

H. Ishii et al. "A Tunable Distributed Amplification DFB Laser Diode (TDA-DFB-LD)," IEEE Photonics Technology Letters, Jan. 1998, vol. 10, No. 1, pp. 30-32.
International Search Report of PCT/JP2007/054330, date of mailing May 1, 2007.

* cited by examiner

*Primary Examiner*—Minsun Harvey
*Assistant Examiner*—Phillip Nguyen
(74) *Attorney, Agent, or Firm*—Westerman, Hattori, Daniels & Adrian, LLP

(57) ABSTRACT

A semiconductor integrated device includes a plurality of wavelength tunable lasers, provided on a semiconductor substrate, and having oscillation wavelength ranges different from each other. Each of the wavelength tunable lasers includes an optical waveguide including, alternately in an optical axis direction, a gain waveguide portion and a wavelength controlling waveguide portion, and a diffraction grating provided over both the gain waveguide portion and the wavelength controlling waveguide portion. A value obtained by dividing a width of the wavelength controlling waveguide portion by a width of the gain waveguide portion in one of the plurality of wavelength tunable lasers is larger than a value obtained by dividing a width of the wavelength controlling waveguide portion by a width of the gain waveguide portion in a different one of the wavelength tunable lasers, which oscillates on a shorter wavelength side with respect to an oscillation wavelength range of the one wavelength tunable laser.

12 Claims, 11 Drawing Sheets

FIG. 6

| | GAIN WAVEGUIDE WIDTH ($\mu$m) | WAVELENGTH CONTROLLING WAVEGUIDE WIDTH ($\mu$m) |
|---|---|---|
| LD1 | 2.15 | 2.00 |
| LD2 | 2.13 | 2.00 |
| LD3 | 2.11 | 2.00 |
| LD4 | 2.09 | 2.00 |
| LD5 | 2.06 | 2.00 |
| LD6 | 2.04 | 2.00 |
| LD7 | 2.02 | 2.00 |
| LD8 | 2.00 | 2.00 |

FIG. 8

| | GAIN WAVEGUIDE WIDTH (μm) | WAVELENGTH CONTROLLING WAVEGUIDE WIDTH (μm) |
|---|---|---|
| LD1 | 2.00 | 1.90 |
| LD2 | 2.00 | 1.91 |
| LD3 | 2.00 | 1.93 |
| LD4 | 2.00 | 1.94 |
| LD5 | 2.00 | 1.96 |
| LD6 | 2.00 | 1.97 |
| LD7 | 2.00 | 1.99 |
| LD8 | 2.00 | 2.00 |

SEMICONDUCTOR INTEGRATED DEVICE

CROSS-REFERENCE TO RELATED APPLICATION(S)

This application is a continuation Application of a PCT international application No. PCT/JP2007/054330 filed on Mar. 6, 2007 in Japan, the entire contents of which are incorporated by reference.

FIELD

The embodiments discussed herein are related to a semiconductor integrated device wherein wavelength tunable lasers are integrated.

BACKGROUND

Together with drastic increase of the communication demand in recent years, development of a wavelength division multiplexing communication system (WDM communication system) which multiplexes a plurality of signal lights having wavelengths different from each other so that high-capacity transmission may be implemented with one optical fiber is advancing.

In such a wavelength division multiplexing communication system as just described, in order to implement a flexible and an-advanced communication system, a wavelength tunable laser capable of selecting a required wavelength over a wide wavelength range at a high speed is needed.

For example, as a wavelength tunable laser capable of changing over the wavelength at a high speed, a DBR (Distributed Bragg Reflector) laser, a TTG-DFB (Tunable Twin Guide-Distributed Feedback) laser, a TDA-DFB (Tunable Distributed Amplification-Distributed Feedback) laser and so forth have been proposed.

In such wavelength tunable lasers as mentioned above, since variation of an equivalent refractive index of an optical waveguide where current is injected to the optical waveguide is utilized to vary the oscillation wavelength, changeover of the oscillation wavelength can be carried out in the order of several nm.

Particularly, the TDA-DFB laser can be configured such that a mode hopping does not occur and can carry out wavelength control at a high speed through simple control. Further, since a device for the TDA-DFB laser can be produced readily, the TDA-DFB laser is prospective as a wavelength tunable laser for communication.

However, a wavelength tunable laser such as a TDA-DFB laser which can utilize refractive index variation by current injection to an optical waveguide and prevent occurrence of a mode hopping in such a manner as described above cannot fully cover the C-Band (1,525 to 1,565 nm) which is important in the WDM communication system because generally the wavelength variation width thereof is approximately several nm.

Therefore, an array integration type wavelength tunable laser has been proposed wherein a plurality of such wavelength tunable lasers as described above are monolithically integrated in the form of an array in one device so that the wavelength band described above is covered with one device.

For example, since the tuning range (the wavelength variation width) of the TDA-DFB laser is approximately 5 nm, by integrating eight TDA-DFB lasers configured such that the oscillation wavelength ranges thereof are different from each other by 5 nm in one device, a wavelength tunable laser which can oscillate over the overall C-Band can be implemented.

SUMMARY

According to an aspect of the embodiment, a semiconductor integrated device includes a plurality of wavelength tunable lasers, provided on a semiconductor substrate, having oscillation wavelength ranges different from each other, each of the plurality of wavelength tunable lasers includes an optical waveguide including, alternately in an optical axis direction, a gain waveguide portion being capable of generating gain by current injection and a wavelength controlling waveguide portion being capable of controlling an oscillation wavelength by current injection or voltage application, and a diffraction grating provided along the optical waveguide of both the gain waveguide portion and the wavelength controlling waveguide portion, wherein a value obtained by dividing a width of the wavelength controlling waveguide portion by a width of the gain waveguide portion in one of the plurality of wavelength tunable lasers is larger than a value obtained by dividing a width of the wavelength controlling waveguide portion by a width of the gain waveguide portion in a different one of the plurality of wavelength tunable lasers, the different wavelength tunable laser oscillating on a shorter wavelength side with respect to an oscillation wavelength range of the one wavelength tunable laser.

According to another aspect of the embodiment, another semiconductor integrated device includes a plurality of wavelength tunable lasers, provided on a semiconductor substrate, having oscillation wavelength ranges different from each other, each of the plurality of wavelength tunable lasers includes an optical waveguide including, alternately in an optical axis direction, a gain waveguide portion being capable of generating gain by current injection and a wavelength controlling waveguide portion being capable of controlling an oscillation wavelength by current injection or voltage application, and a diffraction grating provided along the optical waveguide of both the gain waveguide portion and the wavelength controlling waveguide portion, wherein the gain waveguide portion of each of the plurality of wavelength tunable lasers has a same layer structure, material and composition, and thickness, the wavelength controlling waveguide portion of each of the plurality of wavelength tunable lasers has a same layer structure, material and composition, and thickness, and the widths of the gain waveguide portion and wavelength controlling waveguide portion in each of the plurality of wavelength tunable lasers are set such that equivalent refractive index difference between the gain waveguide portion and the waveguide controlling waveguide portion in each of the plurality of wavelength tunable lasers is within a permissible range.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 6 is a view illustrating an example of widths of a wavelength controlling waveguide and a gain waveguide of the wavelength tunable lasers which configure the semiconductor integrated device according to the first embodiment.

FIG. 8 is a view depicting an example of widths of a wavelength controlling waveguide and a gain waveguide of the wavelength tunable lasers which configure the semiconductor integrated device according to the second embodiment.

DESCRIPTION OF EMBODIMENTS

Figure 1:
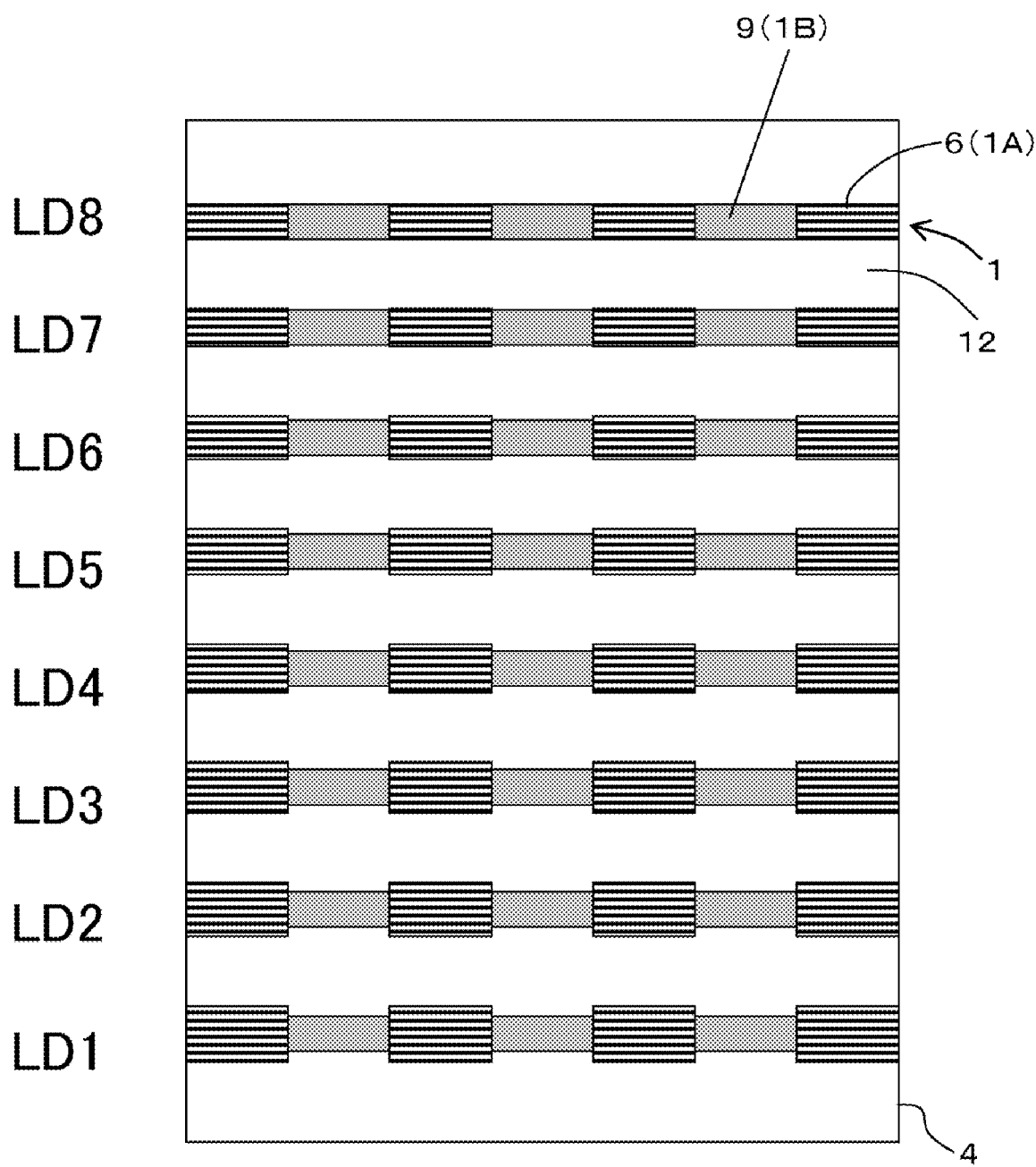
FIG. 1 is a schematic view depicting a plurality of wavelength tunable lasers which configure a semiconductor integrated device according to a first embodiment and is a sectional view taken along line A-A' of FIG. 2.

The TDA-DFB laser includes an optical waveguide having, alternately in an optical axis direction, a gain waveguide portion for generating gain by current injection and a wavelength controlling waveguide portion capable of varying the refractive index thereof by current injection so that the oscillation wavelength of the laser can be varied, and a diffraction grating is formed in the proximity of the optical waveguide.

In such a TDA-DFB laser as described above, similarly to general DFB lasers, the oscillation wavelength is determined depending upon the Bragg wavelength of the diffraction grating. For example, in a TDA-DFB laser for which a diffraction grating whose period is uniform is used, the most stable single-mode oscillation is obtained where the equivalent refractive indexes of the gain waveguide portion and the wavelength controlling waveguide portion coincide with each other.

It is proposed to configure the wavelength tunable laser such that that, in order to obtain single-mode oscillation stabilized over the widest range, the Bragg wavelength in a wavelength controlling region is placed on the longer wavelength side with respect to the Bragg wavelength in a gain region in a state wherein current injection is not carried out to the wavelength controlling waveguide portion.

In an array integration type wavelength tunable laser in which a plurality of such TDA-DFB lasers are integrated, it is preferable to configure all of the TDA-DFB lasers so as to satisfy the condition described above.

However, from a reason described below, it is difficult to configure all of the TDA-DFB lasers which configure an array integration type wavelength tunable laser such that, in a state wherein current injection is not carried out to the wavelength controlling waveguide portion, the Bragg wavelength of the wavelength controlling region is placed on the longer wavelength side within a predetermined range with respect to the Bragg wavelength of the gain region, that is, to provide an equivalent refractive index difference such that the equivalent refractive index of the wavelength controlling waveguide portion becomes larger than the equivalent refractive index of the gain waveguide portion within a predetermined range.

First, the array integration type wavelength tunable laser is generally configured such that all of the integrated TDA-DFB lasers are formed from the same semiconductor material and individually have the same waveguide structure. In particular, all of the TDA-DFB lasers are individually configured so as to include gain waveguide portions and wavelength controlling waveguide portions individually having the same waveguide structure (layer structure), material and composition, thickness and width. This is because, generally where a semiconductor optical waveguide is formed, since a semiconductor material is uniformly deposited on a semiconductor substrate, for example, by the MOCVD method or the like, it is difficult to form layer structures different from each other on the same substrate.

Figure 10:
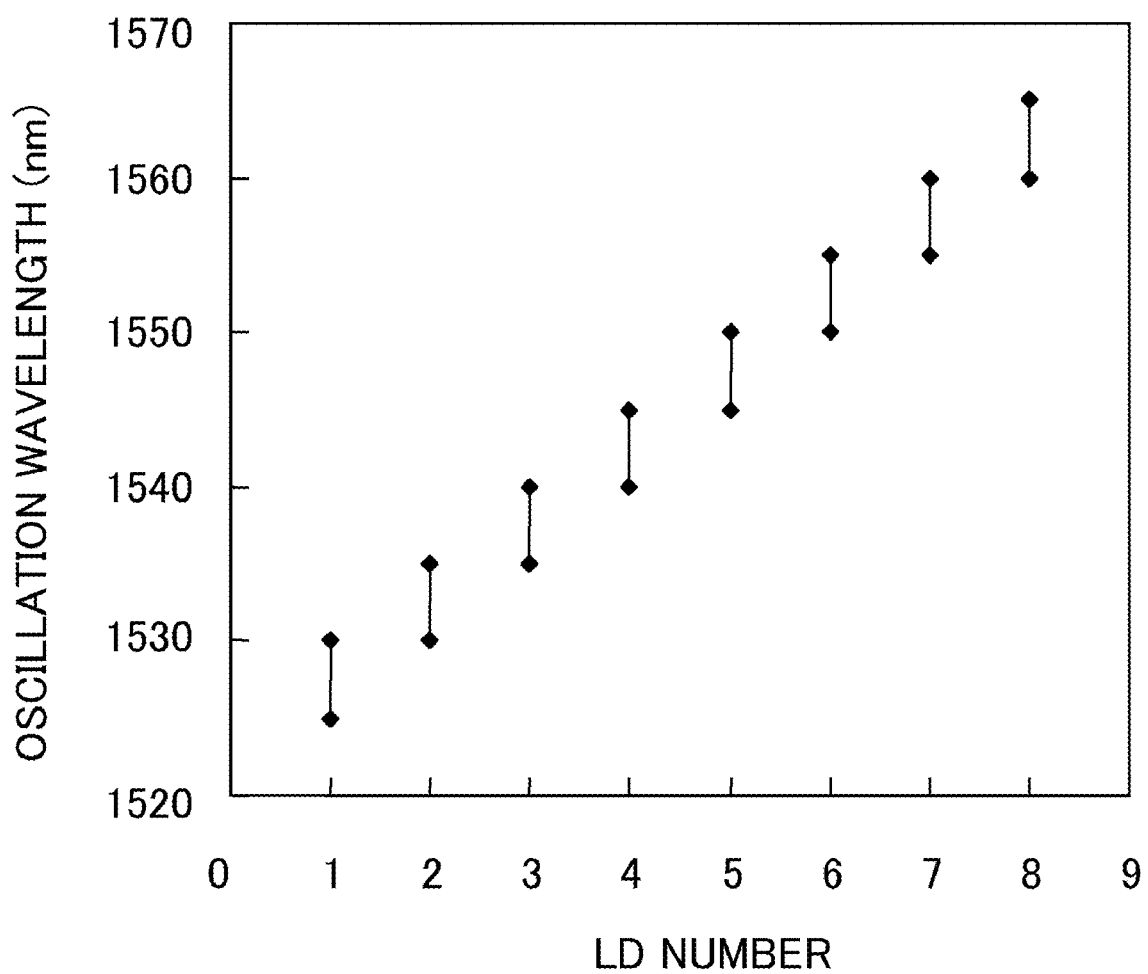
FIG. 10 is a view illustrating an example of setting of oscillation wavelength ranges (wavelength variation ranges) of lasers which configure the array integration type wavelength tunable laser.

Further, in the array integration type wavelength tunable laser, the oscillation wavelength ranges of the integrated TDA-DFB lasers are designed in a displaced relationship by a small amount from each other. For example, in order to implement an array integration type wavelength tunable laser capable of oscillating over the overall C-Band, eight TDA-DFB lasers are integrated and the TDA-DFB lasers LD1 to LD8 are designed so as to have oscillation wavelength ranges of 1,525 to 1,530 nm, 1,530 to 1,535 nm, 1,535 to 1,540 nm, 1,540 to 1,545 nm, 1,545 to 1,550 nm, 1,550 to 1,555 nm, 1,555 to 1,560 nm, 1,560 to 1,565 nm, respectively, as illustrated in FIG. 10.

Figure 11:
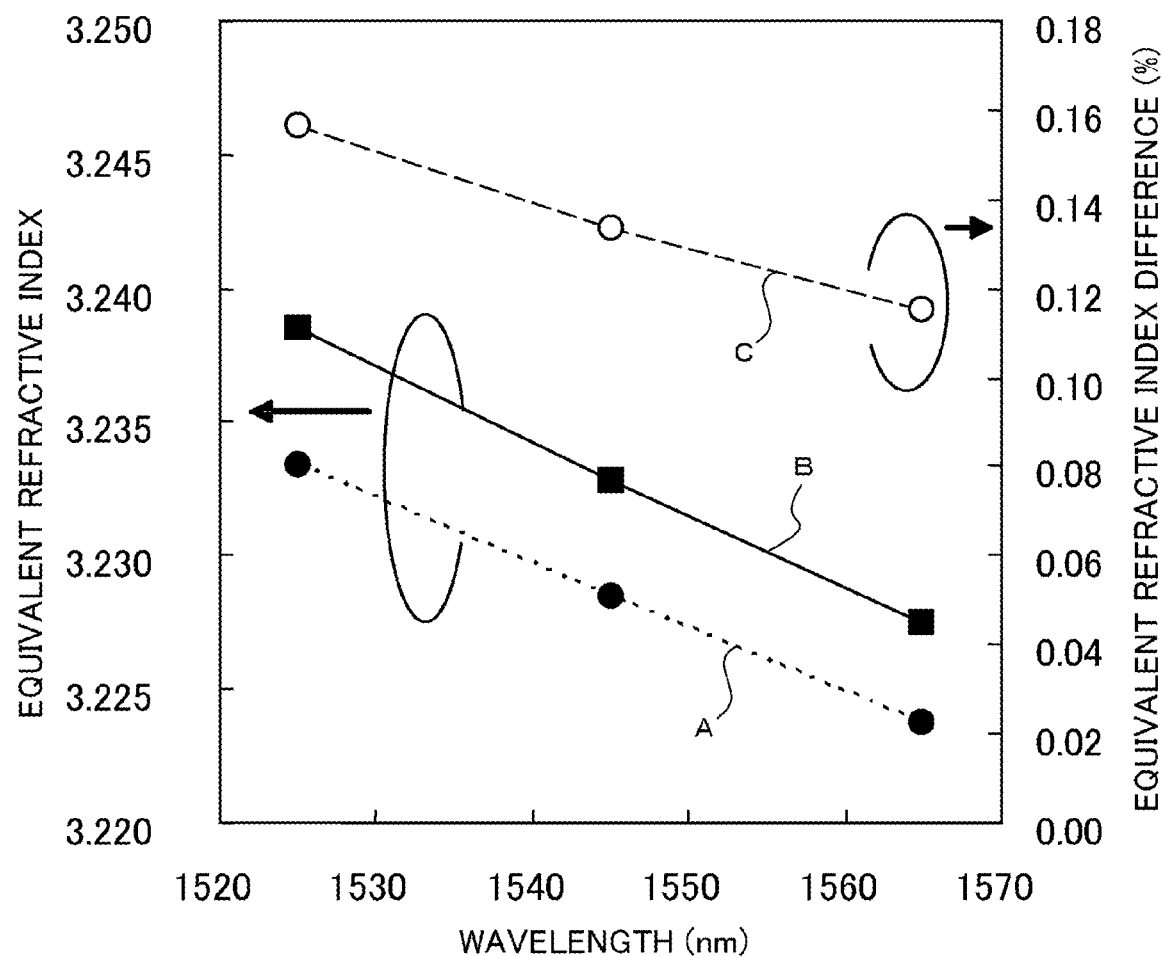
FIG. 11 is a view illustrating wavelength dependencies of equivalent refractive indexes and an equivalent refractive index difference of wavelength controlling waveguide portions and gain waveguide portions of a TDA-DFB laser.

Here, since the equivalent refractive index of the gain waveguide portion of the TDA-DFB laser has the wavelength dependency as indicated by a dotted line A in FIG. 11 and also the equivalent refraction index of the wavelength controlling waveguide portion of the TDA-DFB laser has the wavelength dependency as indicated by a solid line B in FIG. 11, if the TDA-DFB lasers are designed such that they include the gain waveguide portions and wavelength controlling waveguide portions of the same semiconductor material and the same waveguide structure such that the oscillation wavelength ranges of the TDA-DFB lasers are displaced little by little from each other, then the equivalent refractive indexes of the gain waveguide portions and the wavelength controlling waveguide portions of the TDA-DFB lasers becomes different from each other. As a result, also the equivalent refractive index differences (=equivalent refractive index of wavelength controlling waveguide portion−equivalent refractive index of gain waveguide portion) between the wavelength controlling waveguide portions and the gain waveguide portions of the TDA-DFB lasers become different from each other as indicated by a broken line C in FIG. 11.

Therefore, it is difficult to set the equivalent refractive index difference between the wavelength controlling waveguide portions and the gain waveguide portions to an optimum value in all of the TDA-DFB lasers integrated on the same substrate, and as a result, it is difficult to obtain stable single-mode oscillation in all of the TDA-DFB lasers.

It is desirable to provide a semiconductor integrated device wherein, where a plurality of wavelength tunable lasers having oscillation wavelength ranges different from each other are integrated on the same semiconductor substrate, stable single-mode oscillation can be obtained in all of the wavelength tunable lasers (that is, in all of the oscillation wavelength ranges).

In the following, semiconductor integrated devices according to embodiments are described with reference to the drawings.

A semiconductor integrated device includes wavelength tunable lasers having an oscillation wavelength variable over a wide range and at a high speed.

A semiconductor integrated device wherein wavelength tunable lasers are integrated is used as a light source for optical communication.

First Embodiment

First, a semiconductor integrated device according to a first embodiment is described with reference to FIGS. 1 to 6.

As depicted in FIG. 1, the semiconductor integrated device according to the present embodiment is an array integration type wavelength tunable laser including a plurality of (here, eight) wavelength tunable lasers [here, TDA-DFB (Tunable Distributed Amplification-Distributed Feedback) lasers; distributed feedback type wavelength tunable lasers] LD1 to LD8 provided on the same semiconductor substrate 4 and having oscillation wavelength ranges different from each other. It is to be noted that reference numeral 12 denotes an burying layer in FIG. 1.

Figure 2:
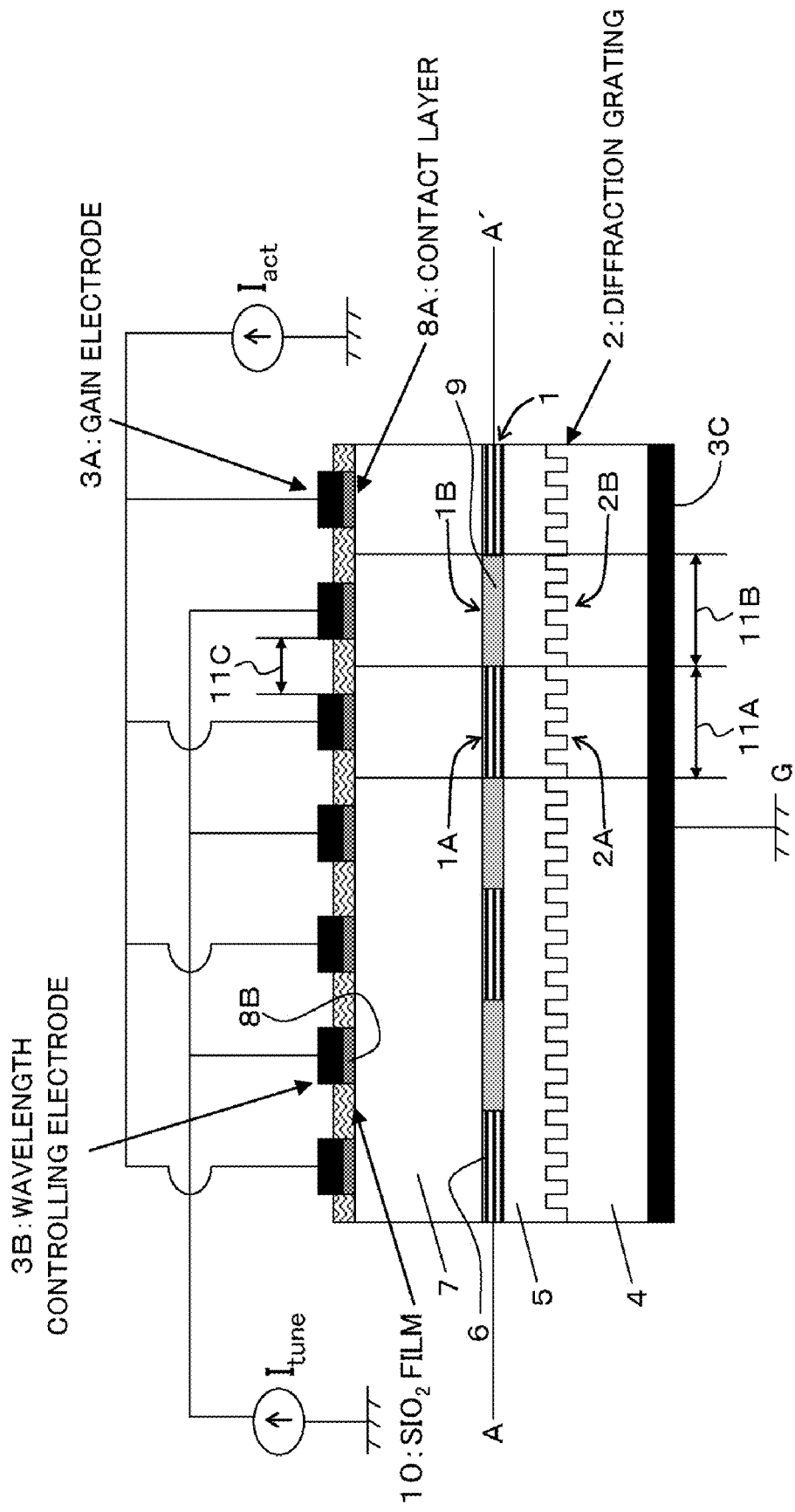
FIG. 2 is a schematic sectional view depicting a configuration of the wavelength tunable lasers which configure the semiconductor integrated device according to the first embodiment.

Here, as depicted in FIGS. 1 and 2, each of the wavelength tunable lasers (current controlling type wavelength tunable lasers) LD1 to LD8 includes an optical waveguide (optical waveguide layer) 1 including a gain waveguide portion 1A being capable of generating gain by current injection and a wavelength controlling waveguide portion 1B being capable of controlling an oscillation wavelength with refractive index variation by current injection and a diffraction grating (diffraction grating layer) 2 provided in the proximity of the optical waveguide 1.

Then, by injecting current (gain controlling current) $I_{act}$ to the gain waveguide portion 1A, the wavelength tunable lasers LD1 to LD8 oscillate with a wavelength in response to a period of the diffraction grating 2. Further, by injecting current (wavelength controlling current) $I_{tune}$ to the wavelength controlling waveguide portion 1B, the wavelength tunable lasers can control oscillation wavelengths.

As depicted in FIG. 2, the optical waveguide 1 includes such gain waveguide portions 1A and such wavelength controlling waveguide portions 1B provided alternately in an optical axis direction. In particular, the optical waveguide 1 is configured such that it includes a plurality of such gain waveguide portions 1A and a plurality of such wavelength controlling waveguide portions 1B and the gain waveguide portions 1A and the wavelength controlling waveguide portions 1B are disposed periodically and alternately in series on the same plane. It is to be noted that a particular example of the configuration of the gain waveguide portion 1A and the wavelength controlling waveguide portion 1B is hereinafter described.

It is to be noted that the gain waveguide portion 1A is an active waveguide configured from a semiconductor material capable of generating light gain by current injection and the wavelength controlling waveguide portion 1B is a waveguide (waveguide which does not generate gain) configured from a semiconductor material whose refractive index can be varied by current injection to vary the oscillation wavelength of a laser.

As depicted in FIG. 2, the diffraction grating 2 is provided in parallel along the optical waveguide 1 over the entire length of the optical waveguide 1 below the optical waveguide 1. In particular, the diffraction grating 2 is continuously provided not only at a position corresponding to the gain waveguide portion 1A but also at a position corresponding to the wavelength controlling waveguide portion 1B. It is to be noted that, as depicted in FIG. 2, the diffraction grating 2 formed at the position corresponding to the gain waveguide portion 1A is hereinafter referred to as gain diffraction grating 2A and the diffraction grating 2 formed at the position corresponding to the wavelength controlling waveguide portion 1B is hereinafter referred to as wavelength controlling diffraction grating 2B.

In this manner, different from the TTG-DFB laser, in each of the wavelength tunable lasers LD1 to LD8, the gain waveguide portion 1A and the wavelength controlling waveguide portion 1B are juxtaposed on the same plane as depicted in FIG. 2. Therefore, a general device fabrication technique can be used and a device can be fabricated readily. Particularly, also where the plural wavelength tunable lasers LD1 to LD8 having oscillation wavelengths different from each other are integrated, a device can be fabricated readily.

Further, since the wavelength tunable lasers LD1 to LD8 have a configuration similar to that of a general DFB laser and is a kind of a DFB laser, phase control need not be carried out upon wavelength variation control as in the case of a DBR laser and simple wavelength control only by wavelength controlling current $I_{tune}$ can be implemented. It is to be noted that, since the diffraction grating 2 is provided over the entire length of the optical waveguide 1 in the wavelength tunable lasers LD1 to LD8, also control of the initial phase need not be carried out.

As depicted in FIG. 2, each of the wavelength tunable lasers LD1 to LD8 includes electrodes 3A and 3B provided independently of each other in the regions of the waveguide portions 1A and 1B in order that current injection can be carried out independently for the gain waveguide portion 1A and the wavelength controlling waveguide portion 1B of the optical waveguide 1.

In particular, as depicted in FIG. 2, the gain electrode (p-side electrode) 3A is formed on the upper face of the gain waveguide portion 1A of the optical waveguide 1 through a contact layer 8A and a common electrode (n-side electrode) 3C is formed below the waveguide portion 1A, and current $I_{act}$ can be injected to an active layer (gain layer, waveguide core layer) 6 of the gain waveguide portion 1A. Further, the wavelength controlling electrode (p-side electrode) 3B is formed on the upper face of the wavelength controlling waveguide portion 1B of the optical waveguide 1 through a contact layer 8B and the common electrode (n-side electrode) 3C is formed below the waveguide portion 1B, and the current $I_{tune}$ can be injected to a wavelength controlling layer (waveguide core layer, phase controlling layer) 9 of the wavelength controlling waveguide portion 1B.

Figure 3:
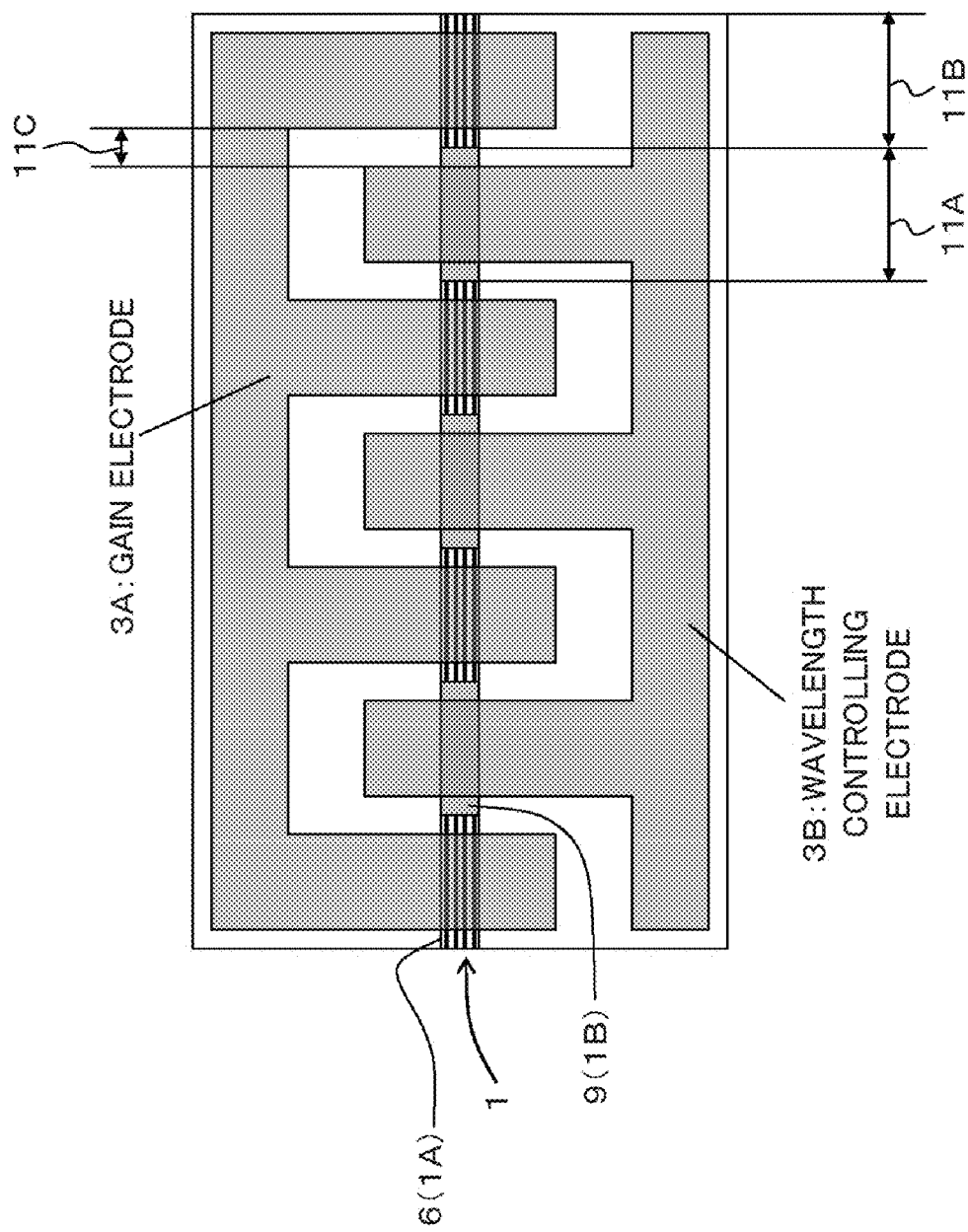
FIG. 3 is a schematic top plan view depicting a configuration of electrodes of the wavelength tunable lasers which configure the semiconductor integrated device according to the first embodiment.

Here, both of the gain electrode 3A and the wavelength controlling electrode 3B are configured as comb type electrodes as depicted in FIG. 3.

It is to be noted that a region configured from the gain waveguide portion 1A, gain diffraction grating 2A, gain electrode 3A and common electrode 3C is hereinafter referred to as gain region 11A and a region configured from the wavelength controlling waveguide portion 1B, wavelength controlling diffraction grating 2B, wavelength controlling electrode 3B and common electrode 3C is hereinafter referred to as wavelength controlling region 11B.

Further, as depicted in FIG. 2, an $SiO_2$ film (passivation film) 10 is formed in a region in which the contact layers 8A and 8B, wavelength controlling electrode (p-side electrode) 3B and gain electrode (p-side electrode) 3A are not formed. In particular, the $SiO_2$ film 10 is formed on the overall area after the contact layers 8A and 8B are formed and only the $SiO_2$ film 10 on the contact layers 8A and 8B is removed and then the p-side electrodes 3A and 3B are formed on the contact layers 8A and 8B, respectively, to form the $SiO_2$ film 10 in the region in which the contact layers 8A and 8B and p-side electrodes 3A and 3B are not formed.

Particularly, as depicted in FIGS. 2 and 3, in order to electrically separate the gain region 11A and the wavelength controlling region 11B from each other, a separation region (separation section) 11C is provided between the gain electrode 3A and the wavelength controlling electrode 3B. In particular, the wavelength controlling electrode (p-side electrode) 3B, gain electrode (p-side electrode) 3A and contact layers 8A and 8B are not formed in a region above and in the proximity of a joint interface between the gain region 11A and the wavelength controlling region 11B thereby to form the separation section 11C.

It is to be noted here that, while the oscillation wavelength is controlled by carrying out current injection to the wavelength controlling waveguide portion 1B, the present invention is not limited to this, and, for example, the semiconductor integrated device may be configured such that voltage application is performed for the wavelength controlling waveguide portion 1B through the wavelength controlling electrode 3B to control the oscillation wavelength.

Incidentally, in the present embodiment, the eight wavelength tunable lasers (TDA-DFB lasers) LD1 to LD8 are arranged and integrated in a parallel arrangement relationship with each other as depicted in FIG. 1.

Oscillation wavelength ranges of the lasers LD1 to LD8 are set, for example, as illustrated in FIG. 10. In particular, the oscillation wavelength ranges of the lasers LD1 to LD8 are individually set to 1,525 to 1,530 nm, 1,530 to 1,535 nm, 1,535 to 1,540 nm, 1,540 to 1,545 nm, 1,545 to 1,550 nm, 1,550 to 1,555 nm, 1,555 to 1,560 nm and 1,560 to 1,565 nm in a spaced relationship by 5 nm from each other from the laser LD1 having the oscillation wavelength range on the shortest wavelength side to the laser LD8 having the oscillation wavelength range on the longest wavelength side.

Here, the lasers LD1 to LD8 are configured such that the oscillation wavelength is placed on the longest wavelength side in a state wherein current is injected to the gain waveguide portion 1A while no current is injected to the wavelength controlling waveguide portion 1B but the oscillation wavelength shifts to the shorter wavelength side as the current is injected to the wavelength controlling waveguide portion 1B.

Therefore, such setting of the oscillation wavelength ranges as described above may be carried out so as to make the period of the diffraction grating 2 different in each of the lasers such that the oscillation wavelength in a state wherein the current is injected to the gain waveguide portion 1A while no current is injected to the wavelength controlling waveguide portion 1B is set to 1,530 nm for the laser LD1, 1,535 nm for the laser LD2, 1,540 nm for the laser LD3, 1,545 nm for the laser LD4, 1,550 nm for the laser LD5, 1,555 nm for the laser LD6, 1,560 nm for the laser LD7 and 1,565 nm for the laser LD8.

By setting the oscillation wavelength ranges of the eight lasers LD1 to LD8 in this manner, the wavelength tunable laser which oscillates in all of the wavelengths of the C-band (1,525 to 1,565 nm) which is important in a wavelength division multiplexing communication system can be implemented.

It is to be noted here that, while the oscillation wavelength ranges of the lasers LD1 to LD8 are set so that the C-band can be covered, the present invention is not limited to this, and the oscillation wavelength ranges of the lasers LD1 to LD8 can be set arbitrarily.

Incidentally, in each of the lasers LD1 to LD8, the Bragg wavelength of the gain region 11A is fixed and the equivalent refractive index of the wavelength controlling waveguide portion 1B of the wavelength controlling region 11B is varied and the Bragg wavelength of the wavelength controlling region 11B is varied thereby to carry out the wavelength variation (tunable) operation.

In the present embodiment, the semiconductor integrated device is configured such that, in order to prevent occurrence of a mode hopping thereby to maintain stable single-mode oscillation while making it possible to effectively use a continuous wavelength variable region (region in which single-mode oscillation can be continuously carried out without causing a mode hopping) in each of the lasers LD1 to LD8, the Bragg wavelength $\lambda_t$ of the wavelength controlling region 11B is displaced to the longer wavelength side with respect to the Bragg wavelength $\lambda_a$ of the gain region 11A in a state wherein current injection or voltage application is not performed for the wavelength controlling waveguide portion 1B and current injection or voltage application for the wavelength controlling waveguide portion 1B is carried out to reduce the equivalent refractive index of the wavelength controlling waveguide portion 1B thereby to displace the Bragg wavelength $\lambda_t$ of the wavelength controlling region 11B to the shorter wavelength side. It is to be noted that, for details of the configuration just described, refer to Japanese Patent Laid-Open No. 2006-295103, the entire content of which is incorporated herein by reference.

Incidentally, generally the equivalent refractive index of the gain waveguide portion and wavelength controlling waveguide portion of the TDA-DFB laser has some wavelength dependency and the equivalent refractive index increases as the wavelength becomes short. Further, the degree of the increase is larger with the wavelength controlling waveguide portion (refer to FIG. 11).

Therefore, where a plurality of such TDA-DFB lasers having oscillation wavelength ranges different from each other are integrated, the equivalent refractive indexes of the gain waveguide portion and the wavelength controlling waveguide portion become different between the lasers, and as a result, also the equivalent refractive index difference (=equivalent refractive index of wavelength controlling waveguide portion−equivalent refractive index of gain waveguide portion) between the gain waveguide portion and the wavelength controlling waveguide portion in each of the lasers become different between the lasers (refer to FIG. 11).

In this instance, (if all of the lasers LD1 to LD8 to be formed on the same semiconductor substrate 4 are designed such that, for example, with the laser LD8 having the oscillation wavelength range on the longest wavelength side,) the equivalent refractive index difference between the waveguide portions has an optimum value and the Bragg wavelength $\lambda_t$ of the wavelength controlling region 11B is displaced to the longer wavelength side by an optimum value with respect to the Bragg wavelength $\lambda_a$ of the gain region 11A, then the other lasers LD1 to LD7 having oscillation wavelength ranges on the shorter wavelength side than the oscillation wavelength range of the laser LD8 are individually placed into a state wherein the equivalent refractive index of the gain waveguide portion 1A is excessively lower than the equivalent refractive index of the wavelength controlling waveguide portion 1B and the equivalent refractive index difference between the gain waveguide portion 1A and the wavelength controlling waveguide portion 1B becomes larger than the optimum value (refer to FIG 11). As a result, the Bragg wavelength $\lambda_t$ of the wavelength controlling region 11B does not displace to the longer wavelength side by the optimum value with respect to the Bragg wavelength $\lambda_a$ of the gain region 11A.

Therefore, in the present embodiment, the widths of all wavelength controlling waveguide portions 1B of the lasers LD1 to LD8 are made equal to each other while the widths of the gain waveguide portions 1A are made different from each other such that the width of the waveguide portion 1A of the laser LD8 having the oscillation wavelength range on the longest wavelength side is smallest and the waveguide width increases as the oscillation wavelength is placed on the shorter wavelength side until the width of the waveguide portion 1A of the laser LD1 having the oscillation wavelength range on the shortest wavelength side becomes greatest as depicted in FIG. 1. It is to be noted that all of the lasers LD1 to LD8 include the gain waveguide portions 1A and wavelength controlling waveguide portions 1B having the same layer structure, material and composition, and thickness.

In short, in the present embodiment, the width of the gain waveguide portion 1A in one of the plural lasers LD1 to LD8 is smaller than the width of the gain waveguide portion 1A in any different laser which oscillates on the shorter wavelength side with respect to the oscillation wavelength range of the one laser and the value obtained by dividing the width of the wavelength controlling waveguide portion 1B by the width of the gain waveguide portion 1A in one of the plural lasers LD1 to LD8 (that is, the ratio of the width of the wavelength controlling waveguide portion 1B to the width of the gain waveguide portion 1A) is larger than the value obtained by dividing the width of the wavelength controlling waveguide portion 1B by the width of the gain waveguide portion 1A in any different laser which oscillates on the shorter wavelength side with respect to the oscillation wavelength range of the one laser.

It is to be noted that, while the widths of the gain waveguide portion 1A and wavelength controlling waveguide portion 1B of each of the lasers LD1 to LD8 are described in the present specification, particularly the width of the gain waveguide portion 1A is the width of the core layer 6 of the gain waveguide portion 1A and the width of the wavelength controlling waveguide portion 1B is the width of the core layer 9 of the wavelength controlling waveguide portion 1B.

Figure 4:
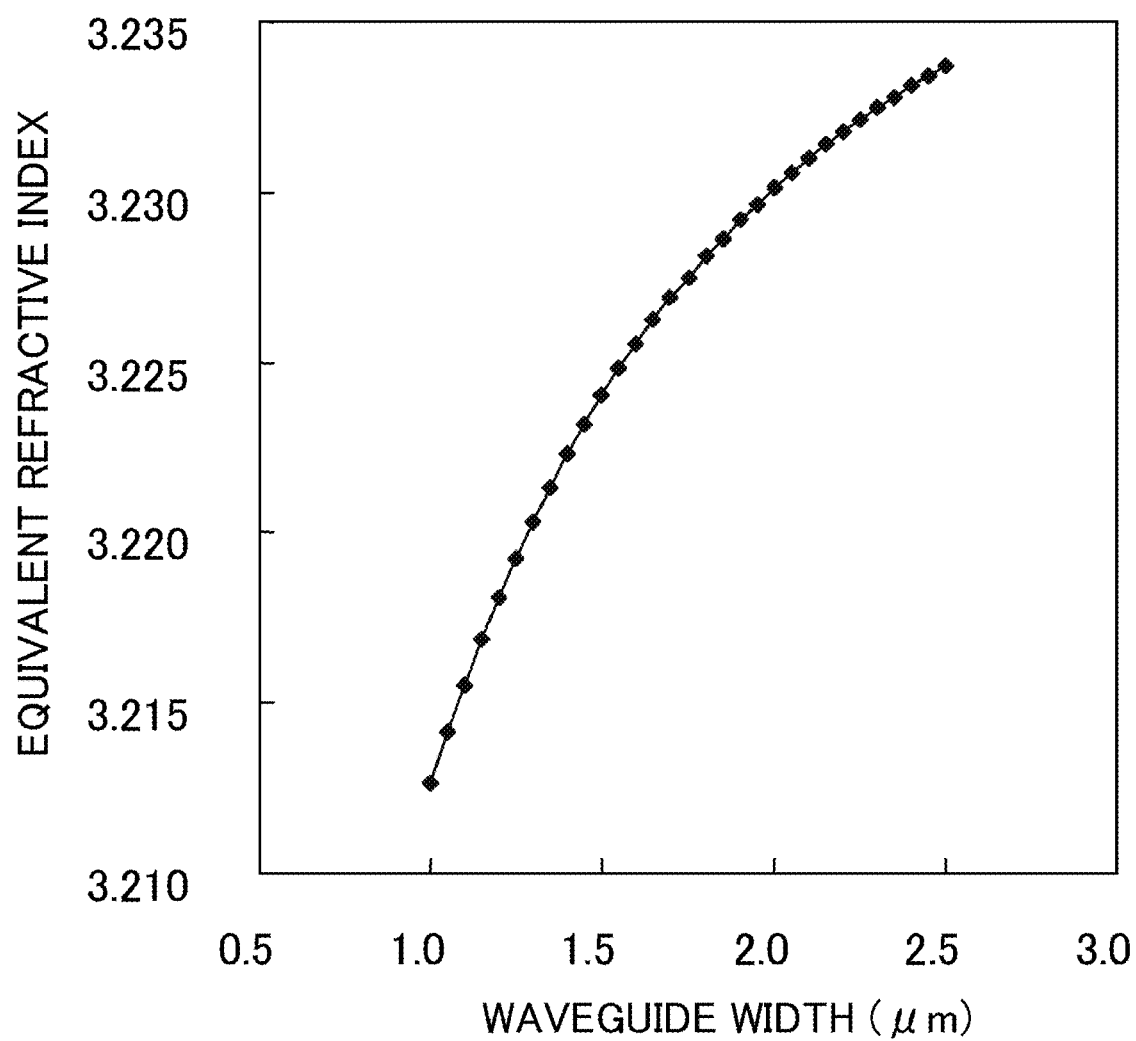
FIG. 4 is a view illustrating a relationship between an equivalent refractive index and a width of a gain waveguide portion of the wavelength tunable laser.

Here, since the equivalent refractive index of the gain waveguide portion 1A increases as the width of the waveguide increases as depicted in FIG. 4, by setting the width of the gain waveguide portion 1A so as to widen as the oscillation wavelength is placed on the shorter wavelength side, the excessively lower equivalent refractive index with respect to that of the wavelength controlling waveguide portion 1B can be compensated for and the equivalent refractive index difference between both of the waveguide portions in all of the lasers LD1 to LD8 can be set within a desired range (for example, from 0.11% to 0.13%).

Consequently, where the plural lasers LD1 to LD8 having oscillation wavelength ranges different from each other are formed on the same semiconductor substrate 4, the equivalent refractive index difference between the gain waveguide portion 1A and the wavelength controlling waveguide portion 1B in each of the lasers LD1 to LD8 is placed within a desired range in a state wherein no current is injected, and the Bragg wavelength $\lambda_t$ of the wavelength controlling region 11B is displaced to the longer wavelength side within a desired range with respect to the Bragg wavelength $\lambda_a$ of the gain region 11A in a state wherein current is injected to the gain waveguide portion 1A but no current is injected to the wavelength controlling waveguide portion 1B. As a result, stable single-mode oscillation can be obtained in any oscillation wavelength range, and a comparatively wide wavelength variable range (tunable range) can be obtained.

A particular example of the configuration of the wavelength tunable lasers (TDA-DFB lasers) LD1 to LD8 is described below.

In the present embodiment, all of the lasers LD1 to LD8 include the gain waveguide portions 1A and wavelength controlling waveguide portions 1B having the same layer structure, material and composition, and thickness, and all of the sectional structures (refer to FIG. 2) of the lasers are same with each other.

First, as depicted in FIG. 2, the gain region (active region) 11A has a layer structure wherein, for example, on an n-type InP substrate (semiconductor substrate; including an n-type InP buffer layer as occasion demands) 4, an n-type InGaAsP diffraction grating layer 2, an n-type InP buffer layer (n-type InP cladding layer) 5, an active layer 6 formed from a 1.55 µm band InGaAsP distortion MQW layer (Multiple Quantum Well; multiple quantum well layer; thickness of 200 nm) designed such that a gain peak wavelength (band gap wavelength) belongs to a 1.55 µm band and upper and lower SCH (Separate Confinement Heterostructure) layers (light confinement layers; individually having a thickness of 50 nm), a p-type InP cladding layer 7 and a contact layer (p-type InGaAsP contact layer; p-type InGaAs contact layer) 8A are stacked in order.

Further, as depicted in FIG. 2, the gain waveguide portion (active waveguide portion) 1A is configured from the n-type InP cladding layer 5, active layer (gain layer, waveguide core layer) 6 and p-InP cladding layer 7.

On the other hand, as depicted in FIG. 2, the wavelength controlling waveguide region 11B has a layer structure wherein, for example, on the n-type InP substrate (semiconductor substrate; including an n-type InP buffer layer as occasion demands) 4, the n-type InGaAsP diffraction grating layer 2, the n-type InP buffer layer (n-type InP cladding layer) 5, an InGaAsP bulk layer (thickness of 250 nm; wavelength controlling layer; phase controlling layer) 9 having a band gap wavelength of 1.43 µm, the p-type cladding layer 7 and a contact layer (p-type InGaAsP contact layer; p-type InGaAs contact layer) 8B are stacked in order.

Further, as depicted in FIG. 2, the wavelength controlling waveguide portion 1B is configured from the n-type cladding layer 5, wavelength controlling layer (waveguide core layer) 9 and p-InP cladding layer 7.

Here, the lengths of one gain waveguide portion 1A and one wavelength controlling waveguide portion 1B are individually set to 30 µm and the length of one period configured from the one gain waveguide portion 1A and the one wavelength controlling waveguide portion 1B is set to 60 µm. It is to be noted that the device length is set, for example, to 570 µm. Further, the gain waveguide portion 1A is disposed on the device end face side so that the light output may not drop. However, the wavelength controlling waveguide portion 1B may be disposed on the device end face side.

Figure 5:
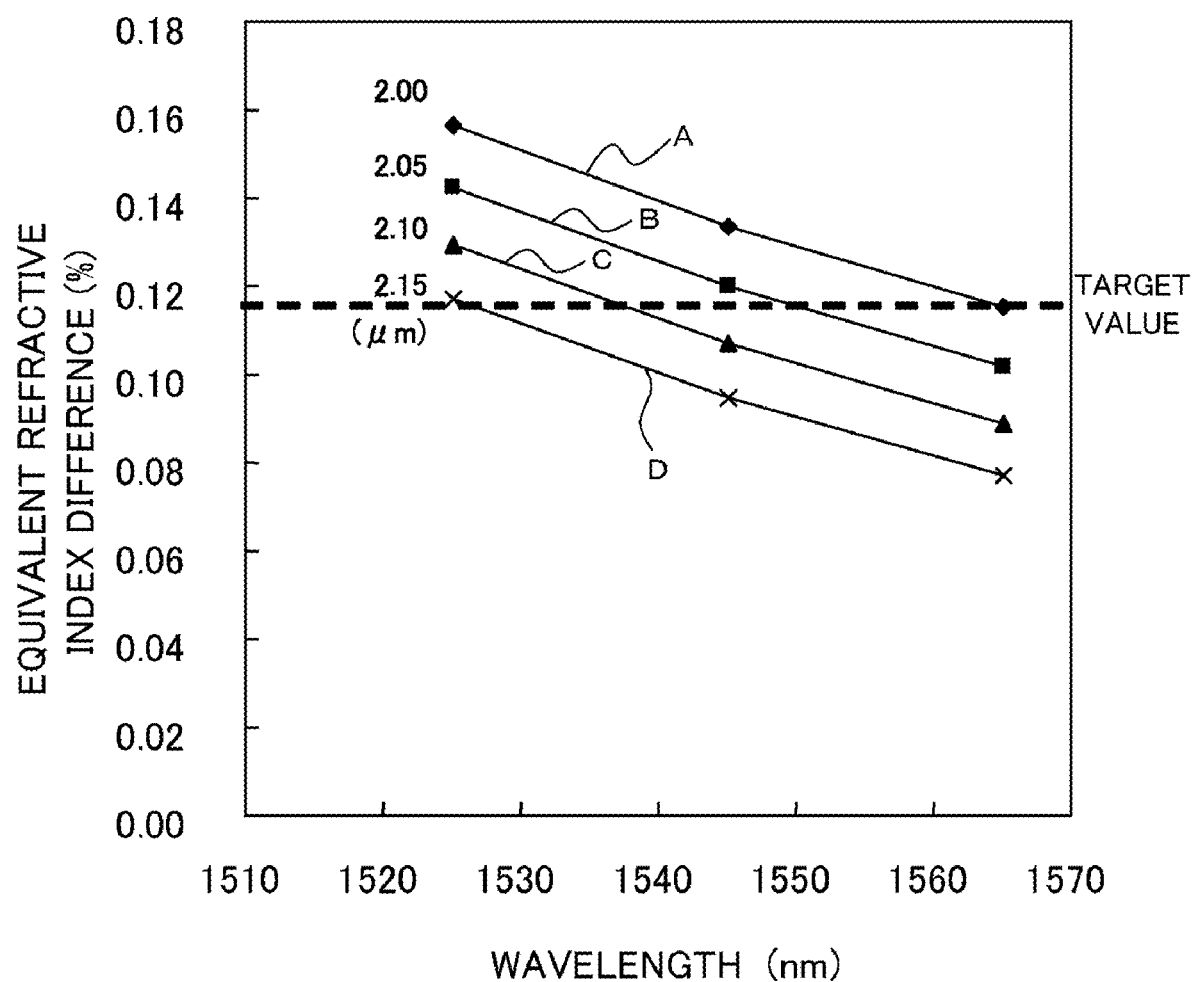
FIG. 5 is a view illustrating a relationship between a wavelength and an equivalent refractive index difference where the width of the gain waveguide portion of the wavelength tunable laser is varied.

In the case of such a layer structure as described above, if, for example, the widths of the gain waveguide portion 1A and the wavelength controlling waveguide portion 1B are individually set to 2.0 µm, then, as indicated by a solid line A in FIG. 5, the equivalent refractive index difference (=equivalent refractive index of wavelength controlling waveguide portion−equivalent refractive index of gain waveguide portion) becomes equal to an optimum value (target value; here, approximately 0.115%) for obtaining stable single-mode oscillation in the proximity of 1,565 nm in a state wherein no current is injected. It is to be noted here that a value (ratio of the equivalent refractive index difference to the reference equivalent refractive index) obtained by dividing the equivalent refractive index difference by the reference equivalent refractive index (here, equivalent refractive index of the gain waveguide portion) is used as a value which indicates the equivalent refractive index difference.

Consequently, the Bragg wavelength $\lambda_t$ of the wavelength controlling region 11B can be displaced to the longer wavelength side by an optimum value with respect to the Bragg wavelength $\lambda_a$ of the gain region 11A in a state wherein the oscillation wavelength is about 1,565 nm and current is injected to the gain waveguide portion 1A but no current is injected to the wavelength controlling waveguide portion 1B.

However, as indicated by the solid line A in FIG. 5, the equivalent refractive index difference increases as the wavelength is placed on the shorter wavelength side, and the equivalent refractive index difference becomes approximately 0.155%, for example, in the proximity of 1,525 nm and is displaced from the optimum value. In other words, the equivalent refractive index of the gain waveguide portion 1A is lower by approximately 0.04% than the optimum value in the proximity of 1,525 nm.

In this manner, while setting both of the widths of the gain waveguide portion 1A and wavelength controlling waveguide portion 1B to 2.0 μm is optimum design to the laser LD8 which oscillates in the oscillation wavelength range of 1,560 to 1,565 nm, the setting described above is displaced from the optimum design in regard to the laser LD1 which oscillates in any other oscillation wavelength range, particularly in the oscillation wavelength range of 1,525 to 1,530 nm.

On the other hand, for example, if the width of the wavelength controlling waveguide portion 1B is set to 2.0 μm and the width of the gain waveguide portion 1A is set to 2.15 μm, then, as indicated by a solid line D in FIG. 5, the equivalent refractive index difference becomes equal to an optimum value (here, approximately 0.115%) for obtaining stable single-mode oscillation in the proximity of 1,525 nm in a state wherein no current is injected. Consequently, the Bragg wavelength $\lambda_t$ of the wavelength controlling region 11B can be displaced by an optimum value to the longer wavelength side with respect to the Bragg wavelength $\lambda_a$ of the gain region 11A in a state wherein current is injected to the gain waveguide portion 1A but no current is injected to the wavelength controlling waveguide portion 1B.

However, as indicated by the solid line D in FIG. 5, the equivalent refractive index difference becomes lower as the wavelength is placed on the longer wavelength side, and the equivalent refractive index difference is approximately 0.075%, for example, in the proximity of 1,565 nm and is displaced from the optimum value. In other words, the equivalent refractive index of the gain waveguide portion 1A in the proximity of 1,565 nm becomes higher by approximately 0.04% than the optimum value.

In this manner, while setting the width of the wavelength controlling waveguide portion 1B to 2.0 μm and setting the width of the gain waveguide portion 1A to 2.15 μm is an optimum design to the laser LD1 which oscillates in the oscillation wavelength range of 1,525 to 1,530 nm, the setting described above is displaced from the optimum design in regard to the laser LD8 which oscillates in any other oscillation wavelength range, particularly in the oscillation wavelength range of 1,560 to 1,565 nm.

Similarly, also in a case wherein the width of the wavelength controlling waveguide portion 1B is set to 2.0 μm and the width of the gain waveguide portion 1A is set to 2.05 μm as indicated by a solid line B in FIG. 5 or also in an alternative case wherein the width of the wavelength controlling waveguide portion 1B is set to 2.0 μm and the width of the gain waveguide portion 1A is set to 2.10 μm as indicated by a solid line C in FIG. 5, similarly as in the case described above, although the configurations just described provide optimum design regarding a laser which oscillates in one oscillation wavelength range, they are displaced from optimum design in regard to a laser which oscillates in any other oscillation wavelength range.

Therefore, in the present embodiment, while the width of the wavelength controlling waveguide portions 1B is fixed to 2.0 μm in all of the lasers LD1 to LD8, the width of the gain waveguide portions 1A is set in order to 2.00 μm, 2.02 μm, 2.04 μm, 2.06 μm, 2.09 μm, 2.11 μm, 2.13 μm and 2.15 μm for the lasers LD8, LD7, LD6, LD5, LD4, LD3, LD2 and LD1 such that the width of the laser LD8 is smallest and the waveguide width increases as the oscillation wavelength range is placed on the shorter wavelength side until the width of the laser LD1 becomes greatest as depicted in FIG. 6.

In particular, in the present embodiment, both of the widths of the gain waveguide portion 1A and wavelength controlling waveguide portion 1B of the laser LD8 which oscillates in the oscillation wavelength range on the longest wavelength side are set to 2.0 μm so that the equivalent refractive index difference becomes equal to an optimum value (here, approximately 0.115%) for obtaining stable single-mode oscillation in a state wherein no current is injected (for example, refer to a solid line A in FIG. 5), and the width of the gain waveguide portions 1A of the other lasers LD1 to LD7 is increased little by little as the oscillation wavelength range is placed on the shorter wavelength side so that the equivalent refractive index of the gain waveguide portions 1A increases little by little as the oscillation wavelength range is placed on the shorter wavelength side. Consequently, the equivalent refractive index difference which increases as the oscillation wavelength range is placed on the shorter wavelength side can be compensated for.

For example, if the waveguide width of the gain waveguide portion 1A in the laser LD1 is set to 2.15 μm, then the equivalent refractive index increases by approximately 0.04% in comparison with that in a case wherein the waveguide width is 2.0 μm. Consequently, deficiency of the equivalent refractive index of the gain waveguide portion 1A decreased by approximately 0.04% from the optimum value in the proximity of 1,525 nm can be compensated for, and the equivalent refractive index difference can be made equal to an optimum value (here, approximately 0.115%) for obtaining stable single-mode oscillation also in the laser LD1 having the oscillation wavelength range on the shortest wavelength side (for example, refer to solid line D in FIG. 5).

Consequently, where optimum design is applied to the laser LD8 which oscillates in the oscillation wavelength range on the longest wavelength side, also in the laser LD1 which oscillates in the oscillation wavelength range on the shortest wavelength side, the Bragg wavelength $\lambda_t$ of the wavelength controlling region 11B can be displaced by an optimum value to the longer wavelength side with respect to the Bragg wavelength $\lambda_a$ of the gain region 11A in a state wherein current is injected to the gain waveguide portion 1A but no current is injected to the wavelength controlling waveguide portion 1B.

Similarly, also in the other lasers LD2 to LD7, by setting the width of the gain waveguide portions 1A in such a manner as described above, the equivalent refractive indexes can be increased, and the equivalent refractive index difference can be made equal to an optimum value (here, approximately 0.115%) for obtaining stable single-mode oscillation (for example, refer to solid lines B and C in FIG. 5). Consequently, also in the other lasers LD2 to LD7, the Bragg wavelength $\lambda_t$ of the wavelength controlling region 11B can be displaced by an optimum value to the longer wavelength side with respect to the Bragg wavelength $\lambda_a$ of the gain region 11A in a state wherein current is injected to the gain waveguide portion 1A but no current is injected to the wavelength controlling waveguide portion 1B.

As described above, in the present embodiment, one wavelength tunable laser (here, LD8) is designed such that the equivalent refractive index thereof becomes equal to an optimum value and the widths of all wavelength controlling waveguide portions 1B of the other wavelength tunable lasers (here, LD1 to LD7) are designed so as to be equal to each other while the width of the gain waveguide portion 1A is adjusted in response to the oscillation wavelength range. Consequently, the equivalent refractive index difference becomes equal to an optimum value in all of the lasers LD1 to LD8 and stable single-mode oscillation can be obtained.

Now, an outline of a fabrication method for the semiconductor integrated device in the present embodiment is described.

It is to be noted that the semiconductor layers are formed using, for example, the MOCVD method.

First, as depicted in FIGS. 1 and 2, using a method similar to a general fabrication method for a DFB laser, the diffraction grating layer 2 is formed above the n-type InP substrate 4 and in a region corresponding to a region at which the optical waveguide 1 (gain waveguide portion 1A and wavelength controlling waveguide portion 1B) is to be disposed.

For example, an InGaAsP layer is formed on the n-type InP substrate (including an n-type InP buffer layer as occasion demands) 4 and resist is applied to the top face of the InGaAsP layer and then a pattern for the diffraction grating is formed using electron beam drawing. Thereafter, part of the InGaAsP layer is removed periodically using a method such as dry etching, and the n-type InP buffer layer 5 is grown on the InGaAsP layer to form the diffraction grating layer 2.

Thereafter, the InGaAsP active layer (distortion MQW layer and upper and lower SCH layers) 6 and part of the p-type InP cladding layer 7 which configure the gain waveguide portion 1A are formed in a stacked state in order on the n-type InP buffer layer 5 as illustrated in FIG. 2.

Then, an $SiO_2$ film (dielectric film) is formed on the top face and then is periodically removed in an optical axis direction to carry out patterning using a general patterning technique so that a region in the form of a band extending in a direction perpendicular to the optical axis direction and including a region in which the gain waveguide portions 1A configuring the eight lasers LD1 to LD8 are to be formed remains.

Then, the InGaAsP active layer 6 and the p-type InP cladding layer 7 which are to configure the gain waveguide portions 1A are periodically removed in the optical axis direction using the patterned $SiO_2$ film as a mask and using, for example, wet etching, and the InGaAsP bulk layer 9 and part of the p-type InP cladding layer 7 which configure the wavelength controlling waveguide portion 1B are formed in a stacked state in order on the portion for which the removing process is performed as depicted in FIG. 2.

Then, the $SiO_2$ film is removed entirely and then the remaining part of the p-type InP cladding layer 7 is formed in a stacked state on the overall face as depicted in FIG. 2.

In this manner, an optical waveguide structure is formed wherein the band-like region extending in the direction perpendicular to the optical axis direction and including the region in which the gain waveguide portions 1A configuring the lasers LD1 to LD8 are to be formed and the band-like region extending in the direction perpendicular to the optical axis direction and including the region in which the wavelength controlling waveguide portions 1B are to be formed are formed periodically in the optical axis direction.

Thereafter, an $SiO_2$ film (dielectric film) is formed on the optical waveguide structure (that is, on the p-type InP cladding layer 7) formed in such a manner as described above, and patterning is carried out using a general patterning technique so that the region (refer to FIG. 1) in which the gain waveguide portions 1A and wavelength controlling waveguide portions 1B individually having a desired width and configuring the lasers LD1 to LD8 remains.

Here, the width of the $SiO_2$ film to be left as a mask pattern is set such that the widths of all wavelength controlling waveguide portions 1B of the lasers LD1 to LD8 are 2.0 μm and same with each other and the widths of the gain waveguide portions 1A are 2.00 μm, 2.02 μm, 2.04 μm, 2.06 μm, 2.09 μm, 2.11 μm, 2.13 μm and 2.15 μm for the lasers LD8, LD7, LD6, LD5, LD4, LD3, LD2 and LD1, respectively.

In this manner, since, only if the dimension of the $SiO_2$ film to be used as a photo mask is adjusted, then the widths of the gain waveguide portions 1A of the lasers LD1 to LD8 can be adjusted, an additional step need not be particularly added in order to change the width of the gain waveguide portions 1A of the lasers LD1 to LD8, and the laser LD1 to LD8 can be fabricated readily.

Then, for example, dry etching is carried as using the patterned $SiO_2$ film as a mask to remove the layers for configuring the gain waveguide portions 1A and wavelength controlling waveguide portions 1B other than those at the portion just under the mask to work (process) the layers into a mesa shape to form mesa structures (refer to FIG. 1).

Thereafter, the mesa structures formed in such a manner as described above are buried with a high-resistance InP burying layer 12 doped with, for example, Fe (refer to FIG. 1), and the p-side electrodes 3A and 3B (top face) and n-side electrode 3C (substrate back face) for injecting current independently to the gain waveguide portion 1A and the wavelength controlling waveguide portion 1B are formed using a general electrode formation technique as depicted in FIG. 2.

Here, the gain electrode (p-side electrode) 3A is formed above the gain waveguide portion 1A through the contact layer 8A and the common electrode (n-side electrode) 3C is formed below the gain waveguide portion 1A. Further, the wavelength controlling electrode (p-side electrode) 3B is formed above the wavelength controlling waveguide portion 1B through the contact layer 8B and the common electrode (n-side electrode) 3C is formed below the wavelength controlling waveguide portion 1B.

Further, as depicted in FIG. 2, the $SiO_2$ film (passivation film) 10 is formed in a region wherein the contact layers 8A and 8B, wavelength controlling electrode (p-side electrode) 3B and gain electrode (p-side electrode) 3A are not formed. In particular, the $SiO_2$ film 10 is formed over the overall face after the contact layers 8A and 8B are formed and only the $SiO_2$ film on the contact layers 8A and 8B is removed and then the p-side electrodes 3A and 3B are formed on the contact layers 8A and 8B, respectively, thereby to form the $SiO_2$ film 10 in the region wherein the contact layers 8A and 8B and the p-side electrodes 3A and 3B are not formed.

Finally, a device is cut out by cleavage and then anti-reflection coating is applied to both end faces.

In this manner, the semiconductor integrated device including the eight wavelength tunable lasers (TDA-DFB lasers) LD1 to LD8 individually having the optical waveguide structure wherein the gain waveguide portions 1A and the wavelength controlling waveguide portions 1B are disposed periodically (alternately) in the optical axis direction.

Accordingly, with the semiconductor integrated device according to the present embodiment, there is an advantage that, where the plural wavelength tunable lasers (TDA-DFB lasers) LD1 to LD8 having the oscillation wavelength ranges different from each other are integrated on the same semiconductor substrate 4, stable single-mode oscillation can be obtained with all of the wavelength tunable lasers (TDA-DFB lasers) LD1 to LD8 (that is, with all of the oscillation wavelength ranges).

Second Embodiment

Now, a semiconductor integrated device according to a second embodiment is described with reference to FIGS. 7 and 8.

The semiconductor integrated device (array integration type wavelength tunable laser) according to the present embodiment is different from that according to the first embodiment described above in the width of the gain waveguide portions and wavelength controlling waveguide portions of the wavelength tunable lasers (TDA-DFB lasers) LD1 to LD8.

Figure 7:
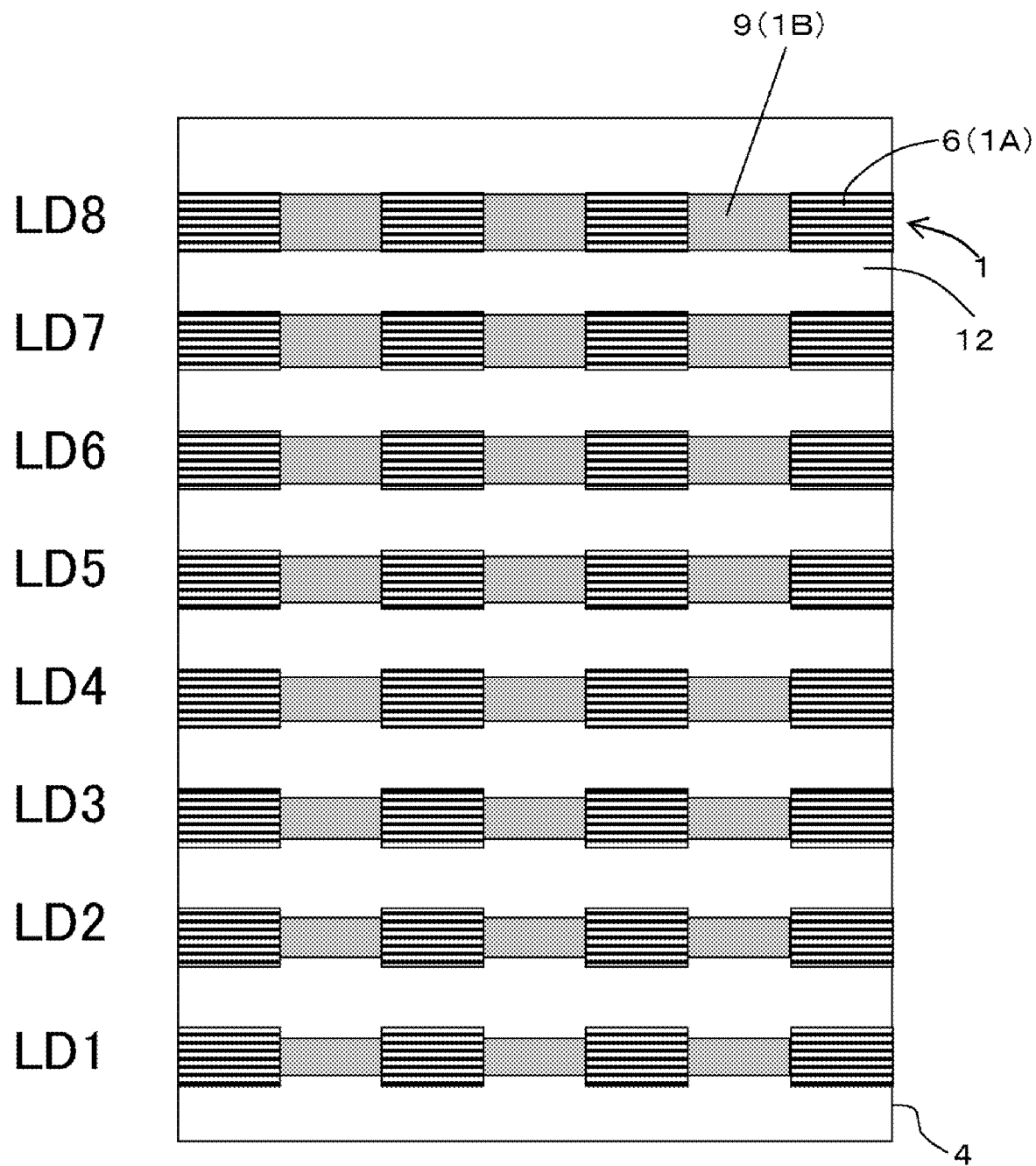
FIG. 7 is a schematic sectional view depicting a plurality of wavelength tunable lasers which configure a semiconductor integrated device according to a second embodiment.

In particular, in the present embodiment, as depicted in FIG. 7, the widths of all gain waveguide portions 1A of the lasers LD1 to LD8 are set same with each other and the widths of the wavelength controlling waveguide portions 1B are different from each other such that the width of the laser LD8 having the oscillation wavelength range on the longest wavelength side is greatest and the waveguide width decreases as the oscillation wavelength is placed on the shorter wavelength side until the width of the laser LD1 having the oscillation wavelength range on the shortest wavelength side becomes smallest. It is to be noted that all of the lasers LD1 to LD8 include the gain waveguide portions 1A and wavelength controlling waveguide portions 1B individually having the same layer structure, material and composition, and thickness. Further, like elements to those in the first embodiment (refer to FIG. 1) described above are denoted by like reference characters in FIG. 7.

In particular, in the present embodiment, the width of the wavelength controlling waveguide portion 1B in one of the plural lasers LD1 to LD8 is larger than the width of the wavelength controlling waveguide portion 1B in any other laser which oscillates on the shorter wavelength side with respect to the oscillation wavelength range of the one laser, and a value obtained by dividing the width of the wavelength controlling waveguide portion 1B by the width of the gain waveguide portion 1A in the one laser (in particular, ratio of the width of the wavelength controlling waveguide portion 1B to the width of the gain waveguide portion 1A) is larger than a value obtained by dividing the width of the wavelength controlling waveguide portion 1B by the width of the gain waveguide portion 1A in any other laser which oscillates on the shorter wavelength side with respect to the oscillation wavelength range of the one laser.

Here, by decreasing the width of the wavelength controlling waveguide portion 1B as the oscillation wavelength is placed on the shorter wavelength side as described above, an excessively high equivalent refractive index with respect to that of the gain waveguide portion 1A can be compensated for and the equivalent refractive index difference between both of the waveguide portions in all of the lasers LD1 to LD8 can be set within a desired range (for example, from 0.11% to 0.13%).

Consequently, where the plural lasers LD1 to LD8 having the oscillation wavelength ranges different from each other are formed on the same semiconductor substrate 4, the equivalent refractive index difference between the gain waveguide portion 1A and the wavelength controlling waveguide portion 1B in the lasers LD1 to LD8 is placed within a desired range in a state wherein no current is injected and the Bragg wavelength $\lambda_t$ of the wavelength controlling region 11B is displaced to the longer wavelength side within the desired range with respect to the Bragg wavelength $\lambda_a$ of the gain region 11A in a state wherein current is injected to the gain waveguide portion 1A but no current is injected to the wavelength controlling waveguide portion 1B. As a result, stable single-mode oscillation can be obtained in any oscillation wavelength range, and a comparatively wide wavelength variable range (tunable range) can be obtained.

In particular, in the present embodiment, while the width of the gain waveguide portions 1A is fixed to 2.0 µm in all of the lasers LD1 to LD8, the width of the wavelength controlling waveguide portions 1B is set in order to 2.00 µm, 1.99 µm, 1.97 µm, 1.96 µm, 1.94 µm, 1.93 µm, 1.91 µm and 1.90 µm for the lasers LD8, LD7, LD6, LD5, LD4, LD3, LD2 and LD1 such that the width of the laser LD8 is greatest and the waveguide width decreases as the oscillation wavelength range is placed on the shorter wavelength side until the width of the laser LD1 becomes smallest as depicted in FIG. 8.

In particular, in the present embodiment, both of the widths of the gain waveguide portion 1A and wavelength controlling waveguide portion 1B of the laser LD8 which oscillates in the oscillation wavelength range on the longest wavelength side are set to 2.0 µm so that the equivalent refractive index difference has an optimum value (here, approximately 0.115%) for obtaining stable single-mode oscillation in a state wherein no current is injected (for example, refer to solid line A in FIG. 5), and the width of the wavelength controlling waveguide portions 1B of the lasers LD1 to LD7 is decreased little by little as the oscillation wavelength range is placed on the shorter wavelength side so that the equivalent refractive indexes of the wavelength controlling waveguide portions 1B decreases little by little as the oscillation wavelength range is placed on the shorter wavelength side. Consequently, the equivalent refractive index difference which increases as the oscillation wavelength range is placed on the shorter wavelength side can be compensated for.

In this manner, in the present embodiment, one (here, LD8) of the wavelength tunable lasers is designed such that the equivalent refractive index difference thereof becomes equal to an optimum value, and, regarding the other wavelength tunable lasers (here, LD1 to LD7), the widths of all gain waveguide portions 1A are designed so as to be same with each other and the widths of the wavelength controlling waveguide portions 1B are adjusted in response to the oscillation wavelength range so that, in all of the lasers LD1 to LD8, the equivalent refractive index difference becomes equal to the optimum value there by to allow stable single-mode oscillation to be obtained.

It is to be noted that the configuration of the other part (for example, the layer structure of the gain waveguide portion 1A and the wavelength controlling waveguide portion 1B, the number of the lasers to be integrated, setting of the oscillation wavelength ranges and so forth) and the fabrication method are same as those of the first embodiment described above, and therefore, description of the same is omitted here.

Accordingly, with the semiconductor integrated device according to the present embodiment, similarly as in that according to the first embodiment described above, there is an advantage that, where the plural wavelength tunable lasers (TDA-DFB laser) LD1 to LD8 having oscillation wavelength ranges different from each other are integrated on the same semiconductor substrate 4, stable single-mode oscillation can be obtained with all of the wavelength tunable lasers (TDA-DFB lasers) LD1 to LD8 (that is, with all of the oscillation wavelength ranges).

Third Embodiment

Next, a semiconductor integrated device according to a third embodiment is described below with reference to FIG. 9.

Figure 9:
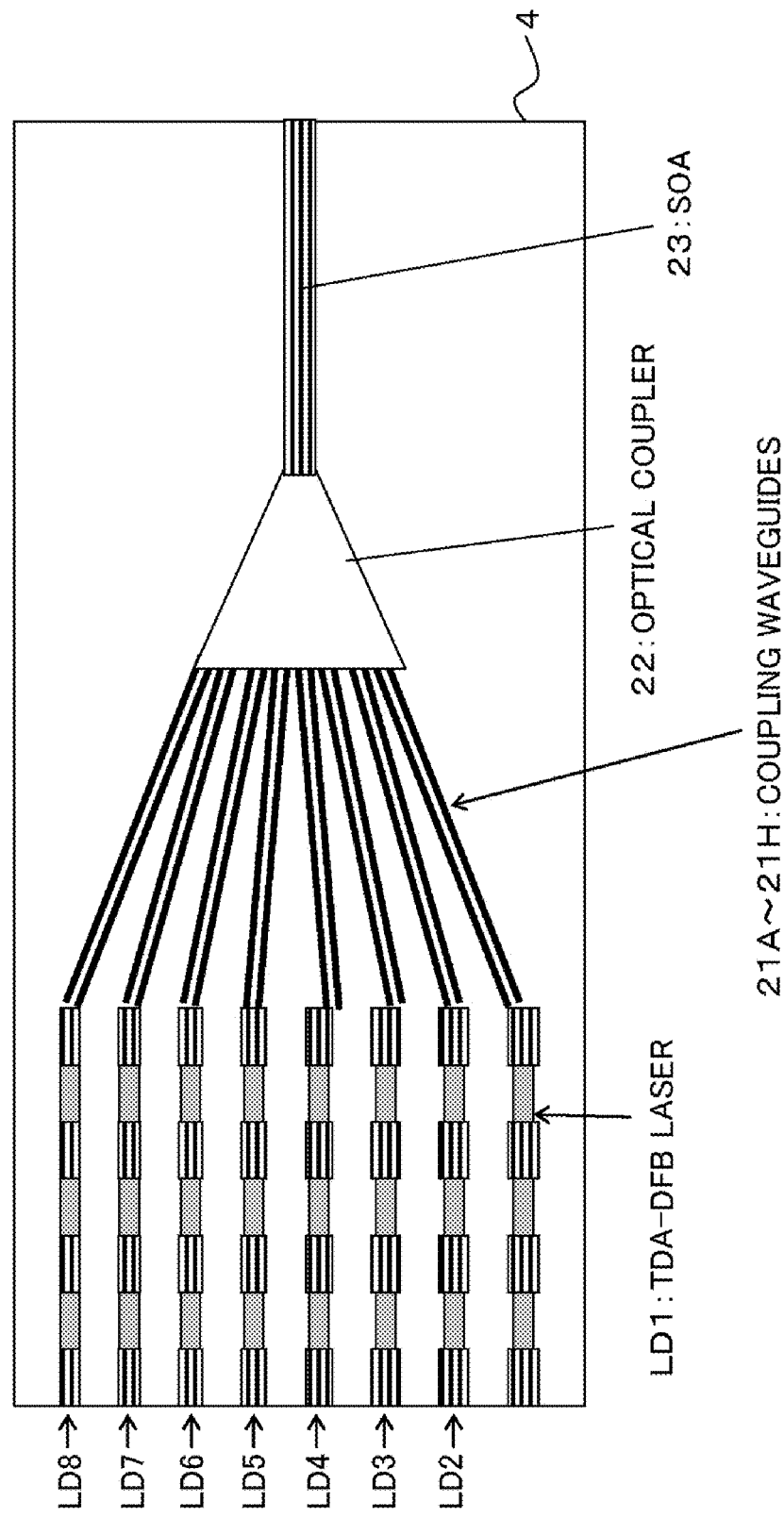
FIG. 9 is a schematic view depicting a configuration of a semiconductor integrated device (array integration type wavelength tunable laser) according to a third embodiment.

As depicted in FIG. 9, the semiconductor integrated device according to the present embodiment has oscillation wavelength ranges (wavelength variable ranges; tunable ranges) different from each other as in the first embodiment described above on the same semiconductor substrate 4 and includes a plurality of (here, eight) wavelength tunable lasers (TDA-DFB lasers) LD1 to LD8 disposed in parallel to each other, a plurality of (here, eight) coupling waveguides (curved waveguide; optical wageguide) 21A to 21H, an optical coupler 22 and an optical amplifier (semiconductor optical amplifier; SOA) 23 for compensating for loss by the optical coupler 22. Then, the semiconductor integrated device in the present embodiment is configured as an array integration type wavelength tunable laser wherein the components just described are integrated in one device. It is to be noted that like elements to those in the first embodiment (refer to FIG. 1) described above are denoted by like reference characters in FIG. 9.

Then, the lasers LD1 to LD8 are connected to the SOA 23 through the coupling waveguides 21A to 21H and the optical coupler 22 such that laser lights (light outputs) emitted from the lasers LD1 to LD8 propagates through the coupling waveguides 21A to 21H, respectively, and the laser lights propagating through the coupling waveguides 21A to 21H are coupled to one laser light by the optical coupler 22 and then the light propagating through the optical coupler 22 is amplified by the SOA 23.

Here, the plural coupling waveguides 21A to 21H and the optical coupler 22 are configured, for example, from an InGaAsP layer having a band gap wavelength of 1.3 μm. Further, for example, a multi-mode interference (MMI) coupler, a star coupler or the like may be used as the optical coupler 22.

Further, the SOA 23 is configured as an element having a layer structure (refer to the first embodiment described above) similar to that of the gain waveguide portion of the lasers LD1 to LD8.

Since, by such a configuration as described above, light emitting ports of all of the lasers LD1 to LD8 are concentrated to one port and sufficient light output can be obtained, the semiconductor integrated device in the present embodiment can be handled similarly to a single laser in assembly of a laser module or the like, and a wavelength tunable laser with which stable single-mode oscillation can be obtained within a wide wavelength range can be implemented.

It is to be noted that, since the detailed configuration and the fabrication method regarding the other part of the wavelength tunable laser are same as those in the first embodiment described above, description thereof is omitted here.

Accordingly, with the semiconductor integrated device (array integration type wavelength tunable laser) according to the present embodiment, similarly as in the first embodiment described above, there is an advantage that, where the plural wavelength tunable lasers (TDA-DFB lasers) LD1 to LD8 having oscillation wavelength ranges different from each other are integrated on the same semiconductor substrate 4, stable single-mode oscillation can be obtained with all of the wavelength tunable lasers (TDA-DFB lasers) LD1 to LD8 (that is, with all of the oscillation wavelength ranges).

It is to be noted that, while an element configured in such a manner as in the first embodiment described above is used for the wavelength tunable lasers (TDA-DFB lasers) in the present embodiment, the present invention is not limited to this. For example, an element configured in such a manner as in the second embodiment described above may be used.

Others

It is to be noted that, while the embodiments described above are described taking, as an example, the case wherein the gain waveguide portions 1A and the wavelength controlling waveguide portions 1B of the wavelength tunable lasers (TDA-DFB lasers) LD1 to LD8 are configured from a layer formed from InGaAsP material systems, the present invention is not limited to this. For example, the waveguide portions can be configured from some other semiconductor material (for example, InGaAlAs material systems, GaInNAs material systems or the like), and an effect similar to that as by the embodiments described above can be obtained also in this instance.

Further, while the embodiments described above are described taking a wavelength tunable laser whose oscillation wavelength range is the 1.55 μm band as a premise, the present invention is not limited to this. For example, the present invention can be applied also to a wavelength tunable laser having a different oscillation wavelength range such as the 1.3 μm band or the like.

Further, while the embodiments described above are described taking, as an example, a case wherein the length of the gain waveguide portion 1A is set to 30 μm and the length of the wavelength controlling waveguide portion 1B is set to 30 μm so that the ratio between the lengths of the paired gain waveguide portion 1A and wavelength controlling waveguide portion 1B is 1:1, the present invention is not limited to this. The gain waveguide portion 1A and the wavelength controlling waveguide portion 1B may each have any length and the ratio between the lengths of the gain waveguide portion 1A and the wavelength controlling waveguide portion 1B may be a different ratio, and also in this instance, an effect similar to that as in the embodiments described above can be obtained.

Further, while the period of the diffraction grating 2 in the embodiments described above is same between the gain region 11A and the wavelength controlling region 11B, the present invention is not limited to this, and the semiconductor integrated device may be configured such that the period of the diffraction grating is different between the gain region and the wavelength controlling region.

Further, while the semiconductor integrated device in the first embodiment described above is configured such that, in all of the lasers LD1 to LD8, the widths of the wavelength controlling waveguide portions 1B are set so as to be same with each other while the widths of the gain waveguide portions 1A are set so as to be different from each other and the semiconductor integrated device in the second embodiment described above is configured such that, in all of the lasers LD1 to LD8, the widths of the gain waveguide portions 1A are set so as to be same with each other while the widths of the wavelength controlling waveguide portions 1B are set so as to be different from each other and then the devices are described separately from each other, the configurations of the embodiments described above may be combined. In short, a wavelength tunable laser oscillating on the shorter wavelength side may be configured such that the widths of the gain waveguides are increased while the widths of the wavelength controlling waveguides are reduced simultaneously.

Further, while the embodiments described above are described taking, as an example, a case wherein the optimum value of the equivalent refractive index difference is approximately 0.115%, this value varies depending upon the length of the gain waveguide portion 1A, the length of the wavelength controlling waveguide portion 1B and the ratio between the lengths of the gain waveguide portion 1A and wavelength controlling waveguide portion 1B paired with each other and the optimum value of the equivalent refractive index difference is not limited to this value. A plurality of wavelength tunable lasers (TDA-DFB lasers) having oscillation wavelengths different from each other may be configured such that the equivalent refractive index difference becomes equal to an optimum value or comes within an optimum range.

Further, while, in the embodiments described above, the widths of the gain waveguide portions 1A or the wavelength controlling waveguide portions 1B of all lasers LD1 to LD8 are varied so that the equivalent refractive index difference becomes equal to an optimum value in all of the wavelength tunable lasers (TDA-DFB lasers) LD1 to LD8 (in particular, while the width of the gain waveguide portions 1A or the wavelength controlling waveguide portions 1B is made different in any two of the plural wavelength tunable lasers), the present invention is not limited to this. For example, the widths of gain waveguide portions or wavelength controlling waveguide portions of each laser may be made different step by step.

For example, the waveguide width in the configuration of the first embodiment described above may be varied at two stages such that the width of the wavelength controlling waveguide portions 1B of the lasers LD1 to LD8 is fixed to 2.00 μm and the width of the gain waveguide portions 1A of the four lasers LD8 to LD5 is fixed to 2.00 μm while the width of the gain waveguide portions 1A of the other four lasers LD4 to LD1 is set to 2.09 μm. In this instance, while, although the equivalent refractive index differences of the lasers LD7 to LD5 and LD3 to LD1 are not exactly equal to an optimum value, but the equivalent refractive index differences of the other lasers LD3 to LD1 become closer to an optimum value than in the case where the width of the gain waveguide portions 1A of the eight lasers is set to same width. Then stable single-mode oscillation is obtained.

Similarly, the waveguide width in the configuration of the second embodiment described above may be varied at two stages such that the width of the gain waveguide portions 1A of the lasers LD1 to LD8 is fixed to 2.00 μm and the width of the wavelength controlling waveguide portions 1B of the four lasers LD8 to LD5 is set to 2.00 μm while the width of the wavelength controlling waveguide portions 1B of the other four lasers LD4 to LD1 is set to 1.94 μm.

In this instance, while, although the equivalent refractive index differences of the lasers LD7 to LD5 and LD3 to LD1 are not exactly equal to an optimum value, but the equivalent refractive index differences of the other lasers LD3 to LD1 become closer to an optimum value than in the case where the width of the wavelength controlling waveguide portions 1B of the eight lasers is set to same width. Then stable single-mode oscillation is obtained.

Further, any laser, whose equivalent refractive index difference is outside an optimum range (outside a permissible range) within which stable single-mode oscillation can be obtained, from among the plural lasers may be configured such that the waveguide width of the gain waveguide portion or the wavelength controlling waveguide portion is varied.

For example, where the widths of the gain waveguide portions 1A and the wavelength controlling waveguide portions 1B of all lasers in the configurations of the first and second embodiments described above are set same with each other, when the equivalent refractive index difference only of the laser LD1 is displaced from the permissible range, only it is necessary to increase the width of the gain waveguide portion 1A of the wavelength tunable laser LD1 or decrease the width of the wavelength controlling waveguide portion 1B so that the equivalent refractive index difference in the laser LD1 comes within the permissible range.

Further, while, in the embodiments described above, the widths of the gain waveguide portion 1A and the wavelength controlling waveguide portion 1B of the laser LD8 having the oscillation wavelength range on the longest wavelength side are set so as to be same with each other and the waveguide structure (layer structure), material and composition, and thickness of the gain waveguide portion 1A and the wavelength controlling waveguide portion 1B are set so that an optimum equivalent refractive index difference in this case is obtained, the present invention is not limited to this. Any other wavelength tunable laser (which may be any one of the lasers LD1 to LD7 or a laser different from the lasers LD1 to LD7) may be configured such that the widths of the gain waveguide portion and the wavelength controlling waveguide portion are set so as to be same with each other and the waveguide structure (layer structure), material and composition, and thickness of the gain waveguide portion and the wavelength controlling waveguide portion are set in order that an optimum equivalent refractive index difference can be obtained.

For example, in the embodiments described above, since the design is carried out with reference to the laser LD8 having an oscillation wavelength range on the longest wavelength side, the width of the gain waveguide portions 1A of the lasers LD7 to LD1 oscillating in oscillation wavelength ranges on the wavelength side shorter than that of the laser LD8 is increased or the width of the wavelength controlling waveguide portions 1B of the lasers LD7 to LD1 is reduced. However, for example, where the design is carried out with reference to the laser LD1 having the oscillation wavelength range on the shortest wavelength side, the width of the gain waveguide portions 1A of the lasers LD8 to LD2 oscillating in oscillation wavelength ranges on the wavelength side longer than that of the laser LD1 is reduced or the width of the wavelength controlling waveguide portions 1B of the lasers LD8 to LD2 is increased.

Further, for example, where the design is carried out with reference to a virtual wavelength tunable laser other than the eight wavelength tunable lasers which configure the semiconductor integrated device, the width of the gain waveguide portions and the width of the wavelength controlling waveguide portions are different from each other in all of the wavelength tunable lasers which configure the semiconductor integrated device.

In particular, it is only necessary that the value obtained by dividing the width of the wavelength controlling waveguide portion by the width of the gain waveguide portion in one of the plural wavelength tunable lasers (that is, the ratio of the width of the wavelength controlling waveguide portion to the width of the gain waveguide portion) be larger than the value obtained by dividing the width of the wavelength controlling waveguide portion by the width of the gain waveguide portion in any other wavelength tunable laser oscillating on the shorter wavelength side with respect to the oscillation wavelength range of the one wavelength tunable laser.

Further, the present invention is not limited to the embodiments specifically described above, and variations and modifications can be made without departing from the scope of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor integrated device comprising:
a plurality of wavelength tunable lasers, provided on a semiconductor substrate, having oscillation wavelength ranges different from each other, each of said plurality of wavelength tunable lasers comprising an optical waveguide including, alternately in an optical axis direction, a gain waveguide portion being capable of generating gain by current injection and a wavelength controlling waveguide portion being capable of controlling an oscillation wavelength by current injection or voltage application, and a diffraction grating provided along the optical waveguide of both the gain waveguide portion and the wavelength controlling waveguide portion;
wherein a value obtained by dividing a width of the wavelength controlling waveguide portion by a width of the gain waveguide portion in one of said plurality of wavelength tunable lasers is larger than a value obtained by dividing a width of the wavelength controlling waveguide portion by a width of the gain waveguide portion in a different one of said plurality of wavelength tunable lasers, the different wavelength tunable laser oscillating on a shorter wavelength side with respect to an oscillation wavelength range of the one wavelength tunable laser.

2. The semiconductor integrated device according to claim 1, wherein the width of the gain waveguide portion in the one wavelength tunable laser is smaller than the width of the gain waveguide portion in the different wavelength tunable laser.

3. The semiconductor integrated device according to claim 1, wherein the width of the wavelength controlling waveguide portion in the one wavelength tunable laser is larger than the width of the wavelength controlling waveguide portion in the different wavelength tunable laser.

4. The semiconductor integrated device according to claim 1, wherein said plurality of wavelength tunable lasers are different from each other in terms of the width of the gain waveguide portion therein.

5. The semiconductor integrated device according to claim 4, wherein said plurality of wavelength tunable lasers are same with each other in terms of the width of the wavelength controlling waveguide portion therein.

6. The semiconductor integrated device according to claim 1, wherein said plurality of wavelength tunable lasers are different from each other in terms of the width of the wavelength controlling waveguide portion therein.

7. The semiconductor integrated device according to claim 6, wherein said plurality of wavelength tunable lasers are same with each other in terms of the width of the gain waveguide portion therein.

8. The semiconductor integrated device according to claim 1, wherein said plurality of wavelength tunable lasers are varied stepwise in terms of the width of the gain waveguide portion therein.

9. The semiconductor integrated device according to claim 1, wherein said plurality of wavelength tunable lasers are varied stepwise in terms of the width of the wavelength controlling section therein.

10. The semiconductor integrated device according to claim 1, wherein said plurality of wavelength tunable lasers are integrated in parallel arrangement to each other.

11. The semiconductor integrated device according to claim 10, further comprising:
a plurality of optical waveguides, said plurality of optical waveguides being connected to said plurality of wavelength tunable lasers, respectively;
an optical coupler adapted to couple lights outputted from each of said plurality of wavelength tunable lasers and propagated through each of said plurality of optical waveguides; and
a semiconductor optical amplifier adapted to amplify the coupled light propagated through said optical coupler.

12. A semiconductor integrated device comprising:
a plurality of wavelength tunable lasers, provided on a semiconductor substrate, having oscillation wavelength ranges different from each other, each of said plurality of wavelength tunable lasers comprising an optical waveguide including, alternately in an optical axis direction, a gain waveguide portion being capable of generating gain by current injection and a wavelength controlling waveguide portion being capable of controlling an oscillation wavelength by current injection or voltage application, and a diffraction grating provided along the optical waveguide of both the gain waveguide portion and the wavelength controlling waveguide portion;
wherein the gain waveguide portion of each of said plurality of wavelength tunable lasers has a same layer structure, material and composition, and thickness;
the wavelength controlling waveguide portion of each of said plurality of wavelength tunable lasers has a same layer structure, material and composition, and thickness; and
the widths of the gain waveguide portion and the wavelength controlling waveguide portion in each of said plurality of wavelength tunable lasers are set such that equivalent refractive index difference between the gain waveguide portion and the waveguide controlling waveguide portion in each of said plurality of wavelength tunable lasers is within a permissible range.

* * * * *